United States Patent
Ganesan et al.

(10) Patent No.: US 12,334,242 B2
(45) Date of Patent: Jun. 17, 2025

(54) CORELESS ELECTRONIC SUBSTRATES HAVING EMBEDDED INDUCTORS

(71) Applicant: Intel Corporation, Santa Clara, CA (US)

(72) Inventors: Sanka Ganesan, Chandler, AZ (US); Sri Chaitra Jyotsna Chavali, Chandler, AZ (US); Robert L. Sankman, Phoenix, AZ (US); Anne Augustine, Chandler, AZ (US); Kaladhar Radhakrishnan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 921 days.

(21) Appl. No.: 17/199,005

(22) Filed: Mar. 11, 2021

(65) Prior Publication Data

US 2022/0293327 A1 Sep. 15, 2022

(51) Int. Cl.
*H01F 27/26* (2006.01)
*H01F 27/40* (2006.01)
*H01F 41/04* (2006.01)

(52) U.S. Cl.
CPC .............. *H01F 27/26* (2013.01); *H01F 27/40* (2013.01); *H01F 41/041* (2013.01)

(58) Field of Classification Search
CPC ......... H01F 27/26; H01F 27/40; H01F 41/041
See application file for complete search history.

(56) References Cited

U.S. PATENT DOCUMENTS

| | | | |
|---|---|---|---|
| 9,230,944 B1 * | 1/2016 | Lambert | H01L 21/4846 |
| 10,122,089 B2 | 11/2018 | Nair et al. | |
| 2014/0034373 A1 * | 2/2014 | Yoshikawa | H01F 5/003 336/200 |
| 2015/0077209 A1 * | 3/2015 | Fujii | H01F 17/0006 336/200 |
| 2017/0290157 A1 * | 10/2017 | Sturcken | H01F 17/0013 |
| 2017/0309578 A1 * | 10/2017 | Eid | H01L 21/4853 |
| 2019/0206814 A1 * | 7/2019 | Deng | H01L 24/16 |
| 2019/0215962 A1 * | 7/2019 | Fukahori | H05K 3/4632 |
| 2019/0295967 A1 * | 9/2019 | Darmawikarta | H01L 24/16 |
| 2019/0393165 A1 * | 12/2019 | Radhakrishnan | H01L 21/4846 |
| 2020/0005990 A1 * | 1/2020 | Paital | H01F 41/043 |
| 2020/0013533 A1 * | 1/2020 | Sankarasubramanian | H01L 24/16 |

OTHER PUBLICATIONS

International Search Report and Written Opinion for PCT Application No. PCT/US2022/015770, dated Jun. 9, 2022.
International Preliminary Report on Patentability from PCT/US2022/015770 notified Sep. 21, 2023, 8 pgs.
Extended European Search Report from European Patent Application No. 22767636.8 notified Aug. 20, 2024, 10 pgs.

* cited by examiner

*Primary Examiner* — Malcolm Barnes

(74) *Attorney, Agent, or Firm* — Essential Patents Group, LLP

(57) ABSTRACT

An inductor can be formed in a coreless electronic substrate, such that the fabrication process does not result in the magnetic material used in the inductor leaching into plating and/or etching solutions/chemistries, and results in a unique inductor structure. This may be achieved by forming conductive vias with a lithographic process, rather than a standard laser process, in combination with panel planarization to prevent exposure of the magnetic material to the plating and/or etching solutions/chemistries.

14 Claims, 14 Drawing Sheets

CORELESS ELECTRONIC SUBSTRATES HAVING EMBEDDED INDUCTORS

TECHNICAL FIELD

Embodiments of the present description generally relate to the field of electronic substrates and, more particularly, to the integration of magnetic materials into coreless electronic substrates to form inductors.

BACKGROUND

The integrated circuit industry is continually striving to produced ever faster and smaller integrated circuit devices for use in various server and mobile electronic products, including but not limited to, computer server products and portable products, such as wearable integrated circuit systems, portable computers, electronic tablets, cellular phones, digital cameras, and the like. However, achieving these goals increases power delivery demands for the integrated circuit devices.

These power delivery demands are supported by inductors, which are used to stabilize electrical current in the integrated circuit devices. As will be understood to those skilled in the art, inductors are passive electrical components electrically attached to an electronic substrate to which the integrated circuit devices are electrically attached. These inductors store energy in a magnetic field generated by a magnetic material and are generally stand-alone components that are electrically attached to the integrated circuit devices. In order to produce faster and smaller integrated circuit devices, these inductors should have high inductance density and high Q factor to improve power conversion. Current solutions include land side attached inductor modules, inductor modules embedded in the electronic substrate, and on-silicon magnetic core inductors, as will be known to those skilled in the art. However, each of these solutions require relatively thick or cored electronic substrates and/or result in a Z-height that would be too high for some applications, and they are not amenable for use in coreless electronic substrates.

One solution that may be more amenable option for coreless packages is the use of magnetic resins to form the inductors. Magnetic resins consist of magnetic fillers embedded in an organic dielectric epoxy matrix, which can be made into laminate films or printable pastes. However, these magnetic resins may only provide limited improvement in magnetic properties, such as permeability. Also, these magnetic resins may be incompatible with standard fabrication processes, such as wet plating and etching (e.g., de-smear, electroless copper seed formation, seed etching, metal roughening baths, and the like), as the magnetic fillers in the magnetic resins can leach into the plating and/or etching solutions/chemistries. The leaching of the magnetic fillers in the magnetic resins, even at a low number of parts per million, into the plating and/or etching solutions/chemistries may have a detrimental impact on the quality, process stability, and useful life of the solutions/chemistries. As a result, the formulation of the magnetic resin may have to be tailored to suit the standard fabrication processes, which may be detrimental to the magnetic properties of the magnetic resins.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

Figure 1:
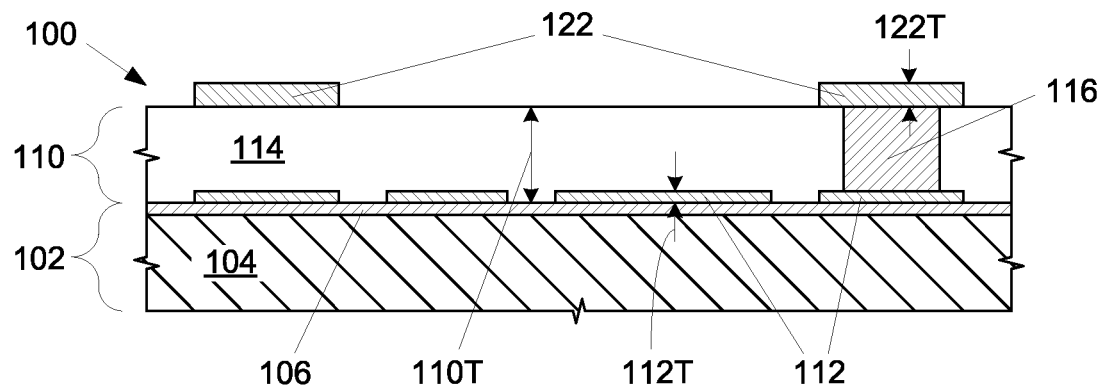
FIGS. 1-14 are side cross-sectional views of a process for the fabrication of an inductor in an electronic substrate, according to an embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The term "package" generally refers to a self-contained carrier of one or more dice, where the dice are attached to the package substrate, and may be encapsulated for protection, with integrated or wire-bonded interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit.

Here, the term "cored" generally refers to a substrate of an integrated circuit package built upon a board, card or wafer comprising a non-flexible stiff material. Typically, a small printed circuit board is used as a core, upon which integrated circuit device and discrete passive components may be soldered. Typically, the core has vias extending from one side to the other, allowing circuitry on one side of the core to be coupled directly to circuitry on the opposite side of the core. The core may also serve as a platform for building up layers of conductors and dielectric materials.

Here, the term "coreless" generally refers to a substrate of an integrated circuit package having no core. The lack of a core allows for higher-density package architectures, as the through-vias have relatively large dimensions and pitch compared to high-density interconnects.

Here, the term "land side", if used herein, generally refers to the side of the substrate of the integrated circuit package closest to the plane of attachment to a printed circuit board, motherboard, or other package. This is in contrast to the term "die side", which is the side of the substrate of the integrated circuit package to which the die or dice are attached.

Here, the term "dielectric" generally refers to any number of non-electrically conductive materials that make up the structure of a package substrate. For purposes of this disclosure, dielectric material may be incorporated into an integrated circuit package as layers of laminate film or as a resin molded over integrated circuit dice mounted on the substrate.

Here, the term "metallization" generally refers to metal layers formed over and through the dielectric material of the package substrate. The metal layers are generally patterned to form metal structures such as traces and bond pads. The metallization of a package substrate may be confined to a single layer or in multiple layers separated by layers of dielectric.

Here, the term "bond pad" generally refers to metallization structures that terminate integrated traces and vias in integrated circuit packages and dies. The term "solder pad" may be occasionally substituted for "bond pad" and carries the same meaning.

Here, the term "solder bump" generally refers to a solder layer formed on a bond pad. The solder layer typically has a round shape, hence the term "solder bump".

Here, the term "substrate" generally refers to a planar platform comprising dielectric and metallization structures. The substrate mechanically supports and electrically couples one or more IC dies on a single platform, with encapsulation of the one or more IC dies by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

Here, the term "assembly" generally refers to a grouping of parts into a single functional unit. The parts may be separate and are mechanically assembled into a functional unit, where the parts may be removable. In another instance, the parts may be permanently bonded together. In some instances, the parts are integrated together.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, magnetic or fluidic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

Embodiments of the present description relate to inductors for use in integrated circuit devices and to the formation of such inductors within coreless electronic substrates, wherein the fabrication process does not result in the magnetic material used in the inductor leaching into plating and/or etching solutions/chemistries. This may be achieved by forming conductive vias of the coreless electronic substrate with a lithographic process, rather than a standard laser process, in combination with panel planarization to prevent exposure of the magnetic material to the plating and/or etching solutions/chemistries. The embodiments of the present description can allow for the fabrication of relatively thick inductor coils, which reduces resistance and improves the performance of the inductor.

FIGS. 1-11 illustrate a process for fabricating an inductor in an electronic substrate, according to an embodiment of the present description. FIG. 1 illustrates a carrier substrate 102 having a first level 110 of an electronic substrate 100 formed thereon. The carrier substrate 102 may comprise a substantially planar structure 104 with an optional release layer 106 formed on the planar structure 104. The planar structure 104 may comprise any appropriate substantially rigid material, including but not limited to, glass, ceramic, metal, and the like. The release layer 106 may be a material that allows for the effective removal of the electronic substrate 100 after the fabrication thereof. In one embodiment, the release layer 106 may comprise a copper foil. The first level 110 of the electronic substrate 100 may comprise at least one first level conductive trace 112 on the release layer 106, a first level dielectric material layer 114 on the at least one first level conductive trace 112 and on the release layer 106, and at least one first level conductive via 116 extending through the first level dielectric material layer 114, wherein the at least one first level conductive via 116 is in contact with the at least one first level conductive trace 112.

The at least one first level dielectric material layer 114 may comprise any appropriate dielectric material, including, but not limited to, bismaleimide triazine resin, fire retardant grade 4 material, polyimide material, silica filled epoxy material, glass reinforced epoxy material, low temperature co-fired ceramic materials, and the like, as well as low-k and ultra low-k dielectrics (dielectric constants less than about 3.6), including, but not limited to, carbon doped dielectrics, fluorine doped dielectrics, porous dielectrics, organic polymeric dielectrics, fluoropolymers, and the like. The first level conductive trace(s) 112 and the first level conductive via(s) 116 may be made of any appropriate conductive material, including but not limited to, metals, such as copper, silver, nickel, gold, and aluminum, alloys thereof, and the like. In one embodiment of the present description, the first level conductive trace(s) 112 may have a thickness 112T of between about 5 and 40 microns. In another embodiment of the present description, the first level 110 may have a thickness 110T of between about 10 and 50 microns.

As further illustrated in FIG. 1, at least one second level conductive trace 122 may be formed on the first level dielectric material layer 114, wherein the at least one second level conductive trace 122 is in contact with the at least one first level conductive via 116. As with the first level conductive trace(s) 112, the at least one second level conductive trace 122 may be formed by any known process and material. In one embodiment of the present description, the second level conductive trace(s) 122 may have a thickness 122T of between about 5 and 45 microns.

Figure 2:
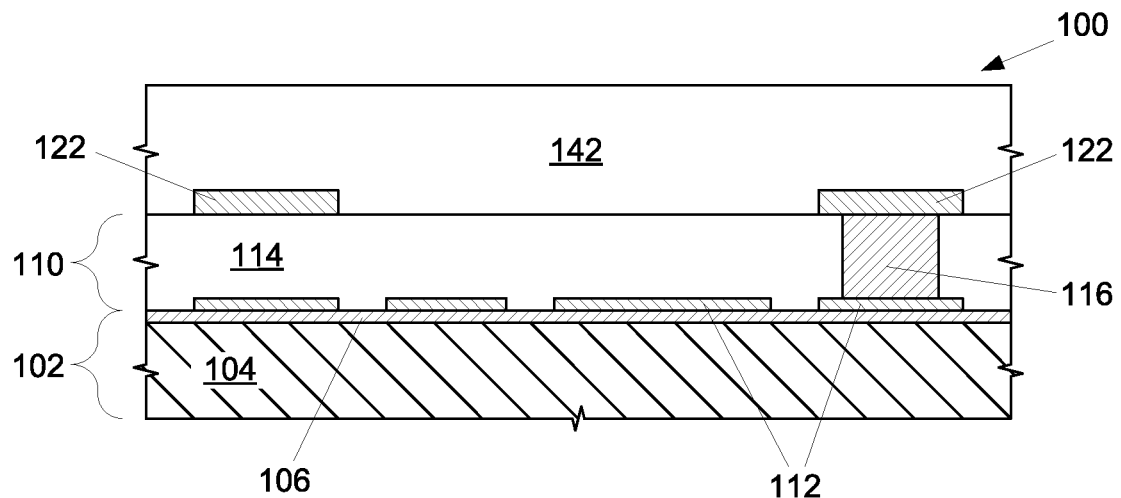
Figure 3:
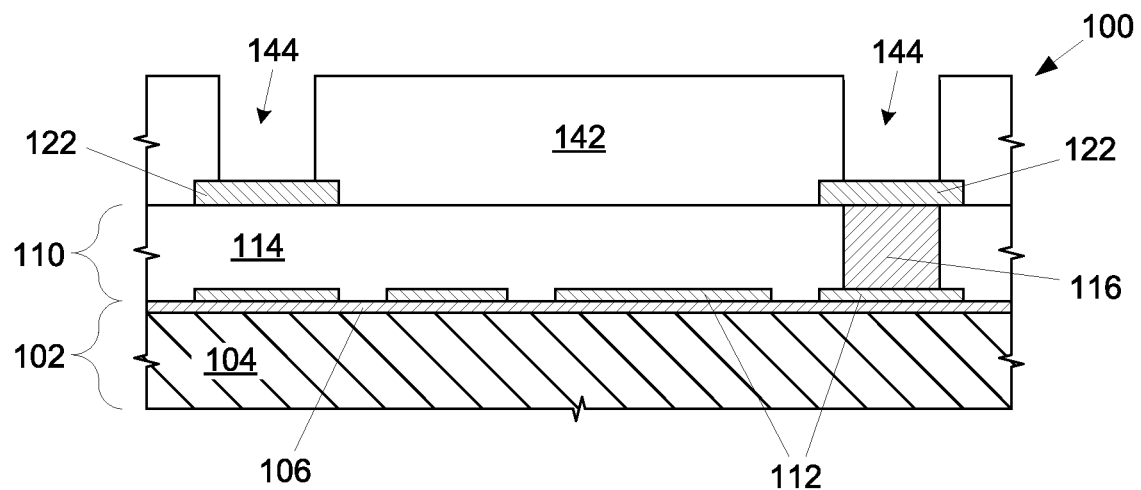
Figure 4:
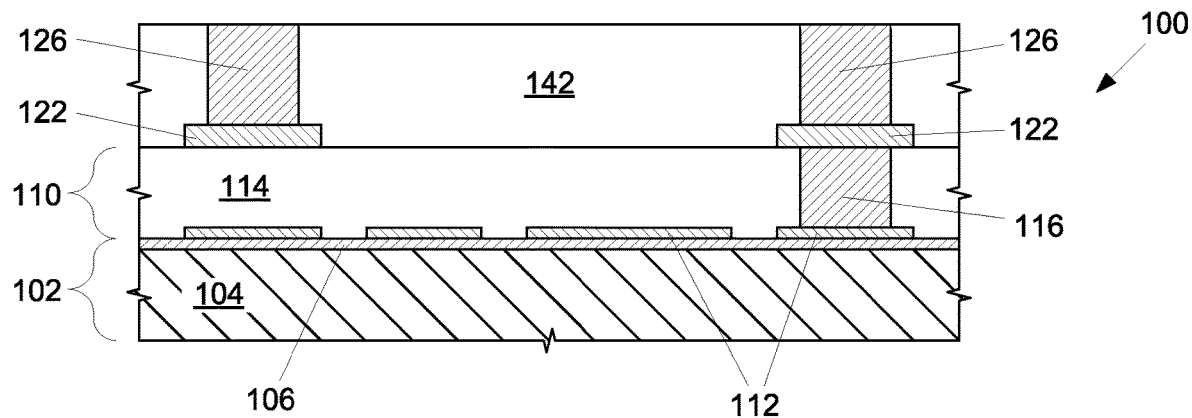
Figure 5:
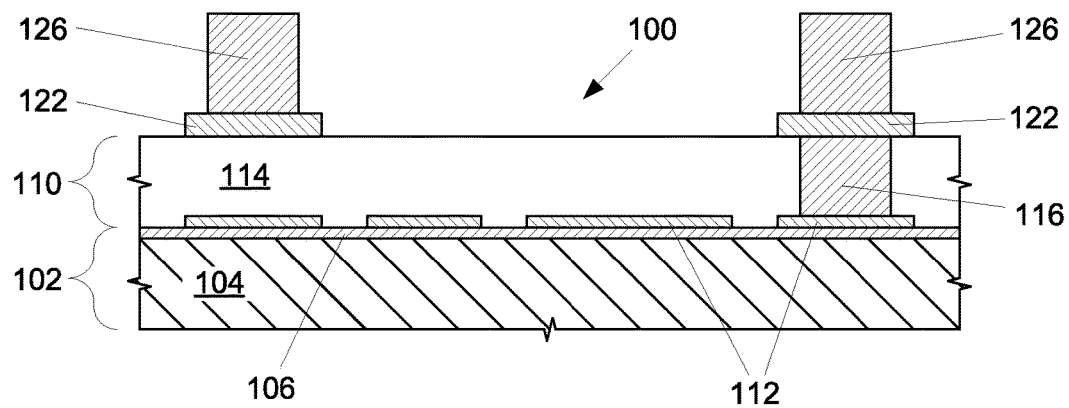
Figure 7:
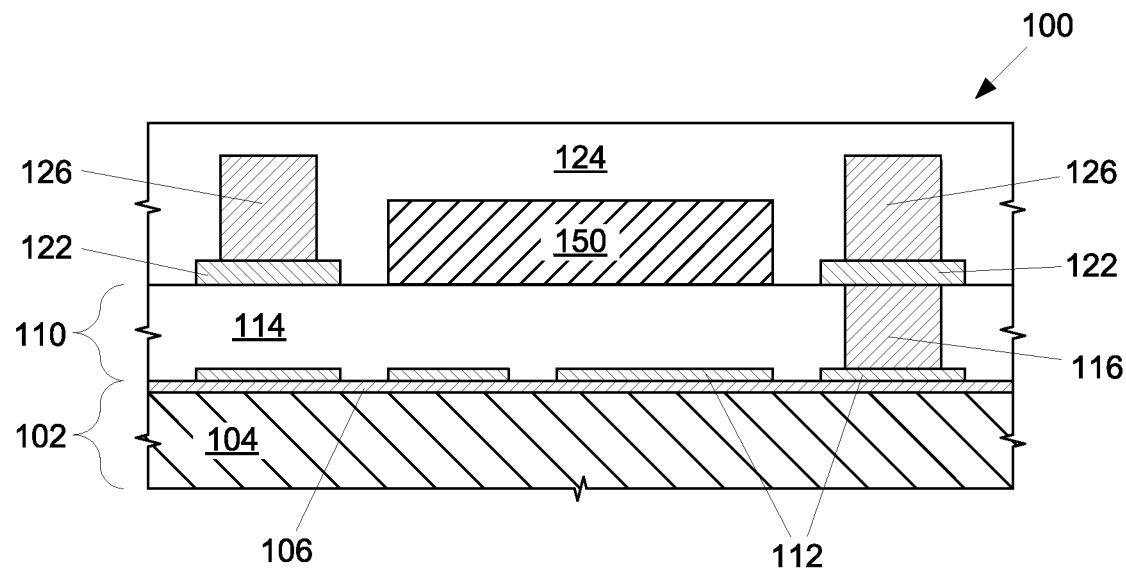

A second level (see element 120 of FIG. 8) of the electronic substrate 100 may be formed with a lithographic process, wherein the second level conductive vias (see element 126 of FIG. 4) are formed before the formation of the second level dielectric material layer (see element 124 of FIG. 7). As shown in FIG. 2, a photoresist material layer 142 may be formed on the first level dielectric material layer(s) 114 and the second level conductive traces 122. At least one opening 144 may be formed in the photoresist material layer 142 to expose at least a portion of an associated second level conductive trace 122 by any known masking/lithographic/etching process, as shown in FIG. 3. These processes are well known in the art and, for the purposes of clarity and conciseness, will not be described in detail. As shown in FIG. 4, a second level conductive via 126 may be formed in each opening 144 (see FIG. 3) by any known process. In one embodiment of the present description, the second level conductive via(s) 126 may be formed by a plating technique. As shown in FIG. 5, the photoresist material 142 (see FIG. 4) may be removed by any technique known in the art, including, but not limited to, plasma ashing, etching, and the like. The second level conductive trace(s) 122 and the second level conductive via(s) 126 may be made of any appropriate conductive material, including but not limited to, metals, such as copper, silver, nickel, gold, aluminum, alloys thereof, and the like.

Figure 6:
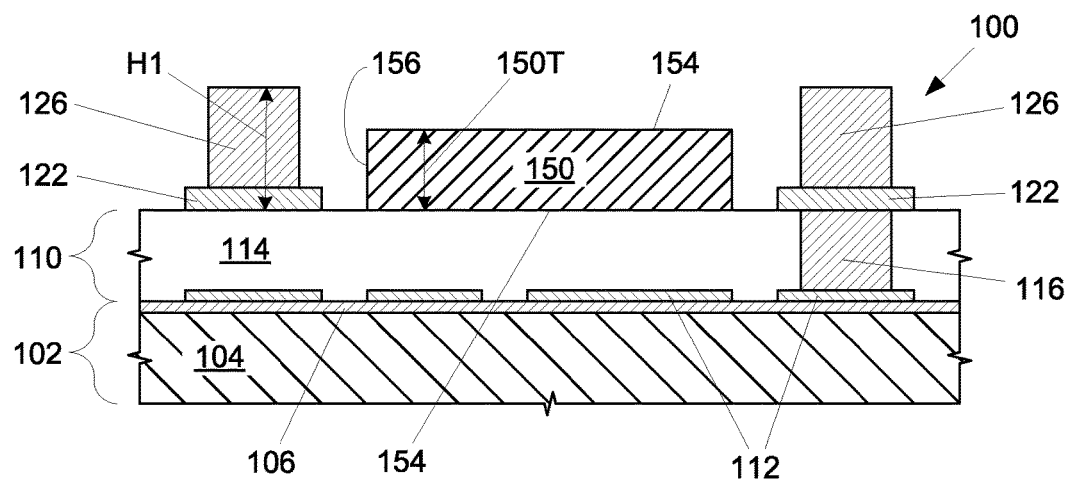

As shown in FIG. 6, a first magnetic element 150 may be formed on the first dielectric material layer 114. The first magnetic element 150 may comprise a first surface 152 abutting the first dielectric material layer 114, an opposing second surface 154, and at least one side 156 extending between the first surface 152 and the second surface 154 of the first magnetic element 150. The first magnetic element 150 may be formed by any process known in the art, including, but not limited to, printing, lamination, and the like. In one embodiment, the first magnetic element 150 may comprise magnetic filler embedded in a resin. The magnetic filler may include, but is not limited to, iron, nickel, cobalt, rare-earth metals, alloys thereof, composites thereof, and the like. The resin may include, but is not limited to, an organic dielectric epoxy matrix. The first magnetic element 150 will be formed to have a thickness 150T that is less than a height H1 of the combination of at least one second level conductive via 126 and associated second level conductive trace 122.

As shown in FIG. 7, a second level dielectric material layer 124 may be formed on the first level dielectric material layer 114, such that it covers the first magnetic element 150 and the second level conductive via(s) 126. The second level dielectric material layer 124 may be formed by any known method and from any appropriate material, such as those previously described with regard to the first level dielectric material layer 114. In one embodiment of the present description, the second level dielectric material layer 124 may be formed by laminating it onto the first level dielectric material layer 114.

Figure 8:
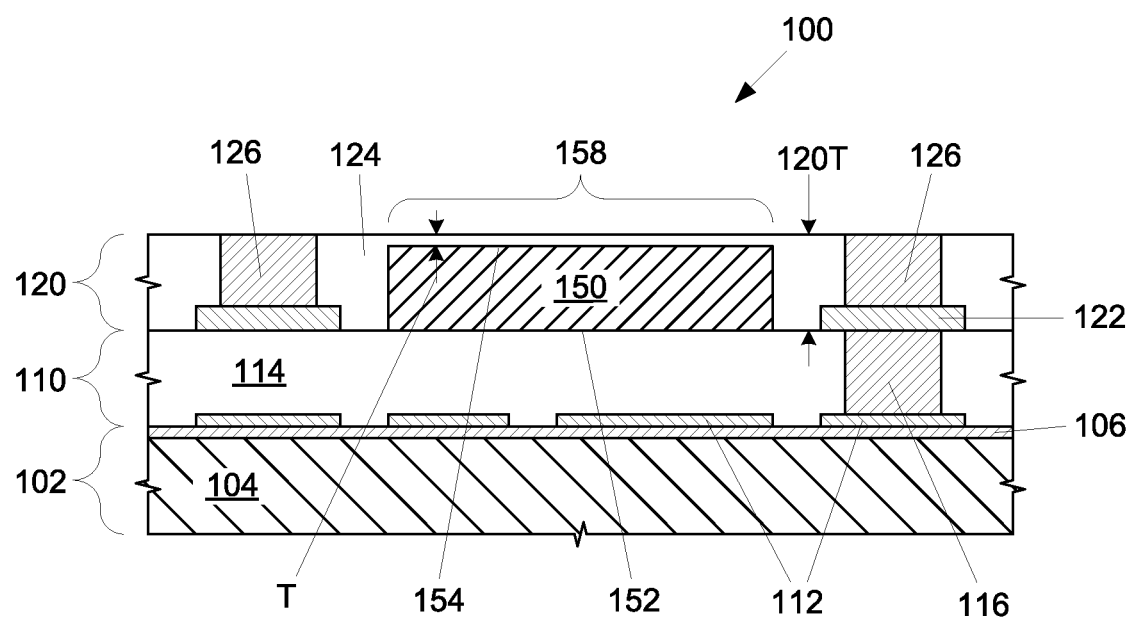

As shown in FIG. 8, a portion of the second level dielectric material layer 124 may be removed to expose the second level conductive via(s) 126, thereby forming a second level 120 of the electronic substrate 100. The removal of the portion of the second level dielectric material layer 124 may be achieved by any technique known in the art, including but not limited to grinding, planarization, etching, and the like. In one embodiment of the present description, the portion of the second level dielectric material layer 124 may be removed by chemical mechanical planarization, as known in the art. As further shown in FIG. 8, a portion of the second level dielectric material layer 124 may remain on the second surface 154 of the first magnetic element 150 and may be, hereinafter, referred to as a dielectric capping layer 158. In one embodiment of the present embodiment, the first magnetic element 150 may be substantially encapsulated by the first level dielectric material layer and the second level dielectric material layer including the portion thereof constituting the dialect capping layer 158.

It is understood that the thickness T of the dielectric capping layer 158 is a tradeoff between having to be thick enough to prevent the leaching of the material of the first magnetic element 150 into the deposition chemistries/plating solutions that may be used in subsequent processing steps, but thin enough to not be unacceptably detrimental to the efficiency of the inductor being formed. It is understood that a variety of techniques and materials, such as etch stop layers, may be utilized to ensure a desire thickness T of the dielectric capping layer 158. In one embodiment of the present description, the thickness T of the dielectric capping layer 158 may be between about 5 and 15 microns. It is understood that the thickness T may vary depending on the material used in the formation of the dielectric capping layer 158. In another embodiment of the present description, the second level 120 may have a thickness 120T of between about 10 and 45 microns.

Figure 9:
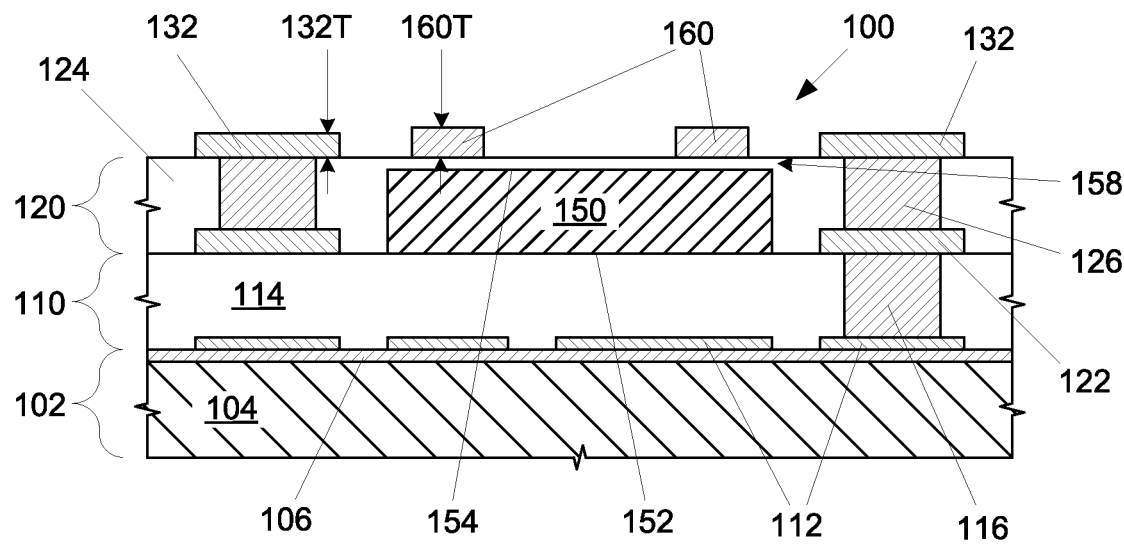

As shown in FIG. 9, an inductor coil 160 may be formed on dielectric capping layer 158 and at least one third level conductive trace 132 may be formed on the second level dielectric material layer 124, wherein the at least one third level conductive trace 132 is in contact with the at least one second level conductive via 126. The inductor coil 160 and the at least one third level conductive trace 132 may be formed by any known processes and materials. In one embodiment, the inductor coil 160 and the at least one third level conductive trace 132 may be formed by a de-smear process (e.g., cleaning and roughening), followed by an electroless seed layer plating, which is followed by a semi additive plating process. These processes are well known in the art and for the purposes of clarity and conciseness will not be described in detail herein. In an embodiment of the present description, the third level conductive trace(s) 132 may have a thickness 132T of between about 15 and 70 microns. In one embodiment of the present description, the inductor coil 160 may have a thickness 160T of between about 15 and 70 microns.

Figure 10:
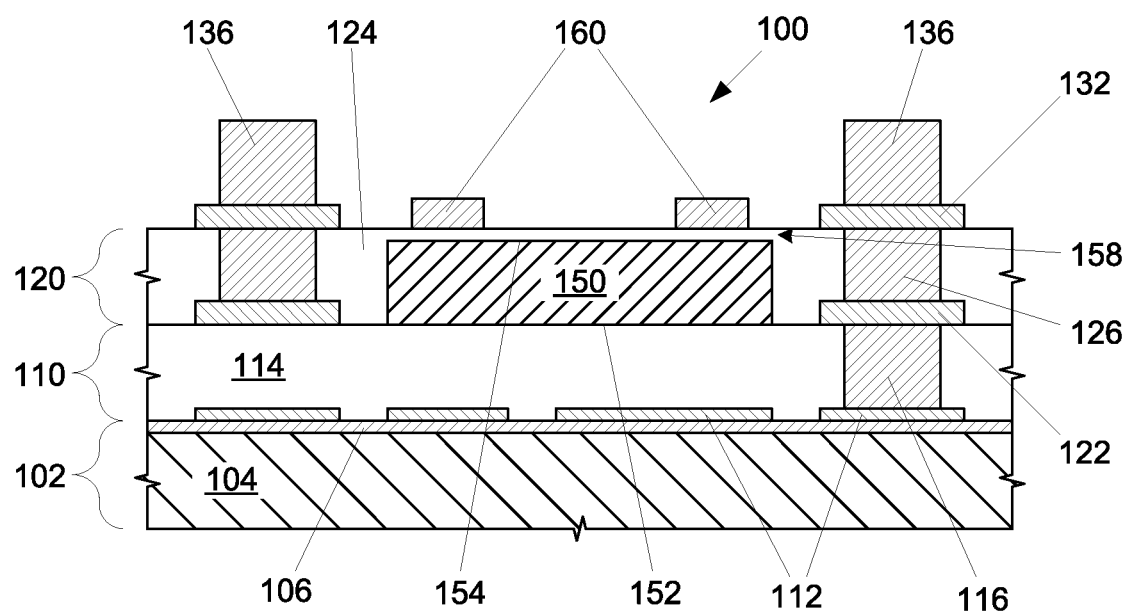

As shown in FIG. 10, at least one third level conductive via 136 may be formed on and in contact with the at least one third level conductive trace 132. The at least one third level conductive via 136 may be formed in the manner described with regard to FIGS. 2-5, and for the purposes of clarity and conciseness will not be described in detail herein. The third level conductive trace(s) 132 and the third level conductive via(s) 136 may be made of any appropriate conductive material, including but not limited to, metals, such as copper, silver, nickel, gold, aluminum, alloys thereof, and the like.

Figure 11:
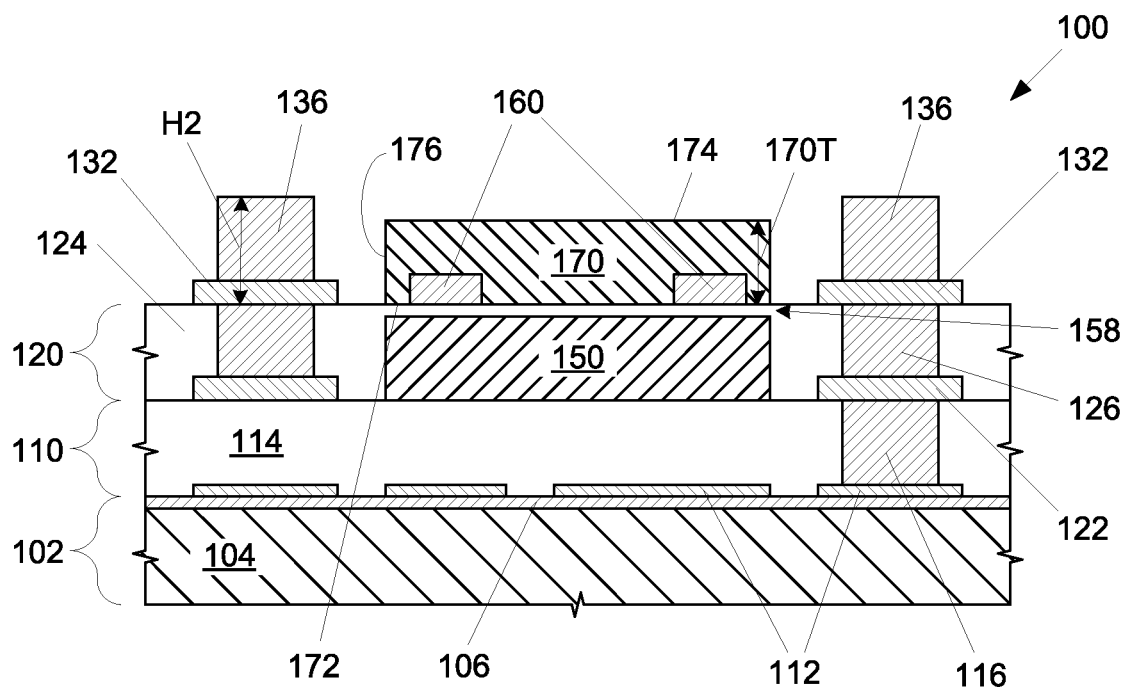

As shown in FIG. 11, a second magnetic element 170 may be formed on the dielectric capping layer 158 of the second dielectric material layer 124 and the inductor coil 160. The second magnetic element 170 may comprise a first surface 172 abutting the dielectric capping layer 158 and an opposing second surface 174, and at least one side 176 extending between the first surface 172 and the second surface 174 of the second magnetic element 170. The second magnetic element 170 will be formed to have a thickness 170T that is less than a height H2 of the combination of at least one third level conductive via 136 and associated third level conductive trace 132. In one embodiment, the second magnetic element 170, in conjunction with the dielectric capping layer 158, may substantially encapsulate the inductor coil 160. The second magnetic element 170 may be formed by any process known in the art, including, but not limited to printing, lamination, and the like. In one embodiment, the second magnetic element 170 may comprise magnetic filler embedded in a resin. The magnetic filler may include, but is not limited to, iron, nickel, cobalt, rare-earth metals, alloys thereof, composites thereof, and the like. The resin may include, but is not limited to, an organic dielectric epoxy matrix.

Figure 12:
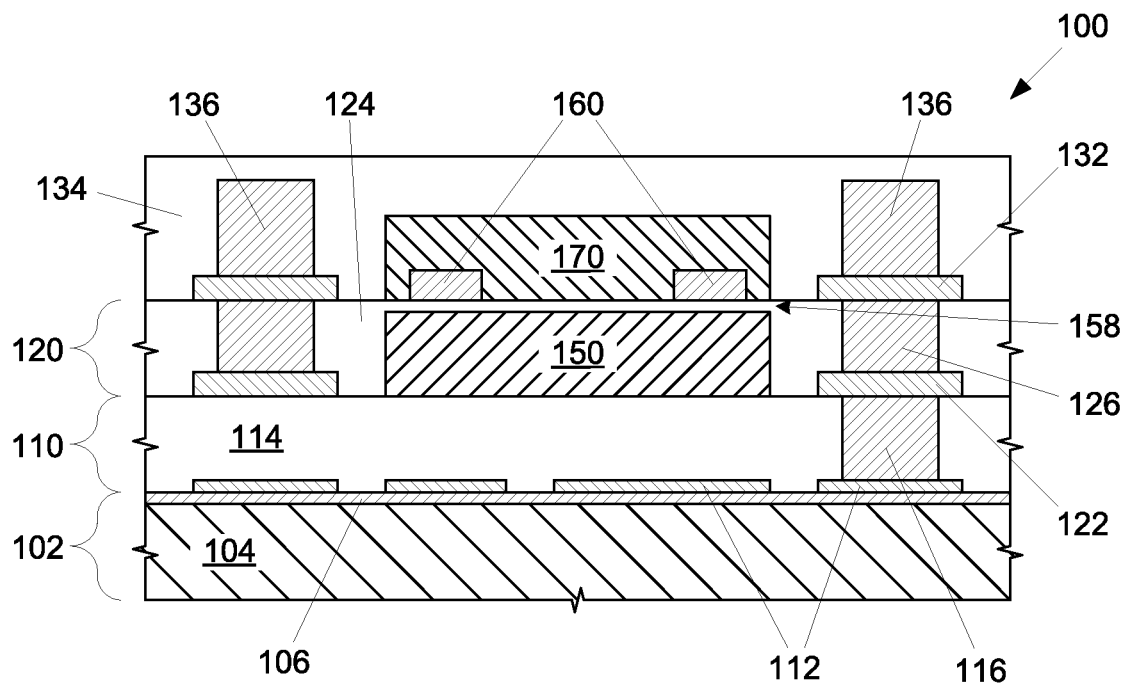

As shown in FIG. 12, a third level dielectric material layer 134 may be formed on the second level dielectric material layer 124, such that it covers the second magnetic element 170 and the third level conductive via(s) 136. The third level dielectric material layer 134 may be formed by any known method and from any appropriate material, such as those previously described with regard to the first level dielectric material layer 114. In one embodiment of the present description, the third level dielectric material layer 134 may be formed by laminating it onto the second level dielectric material layer 124.

Figure 13:
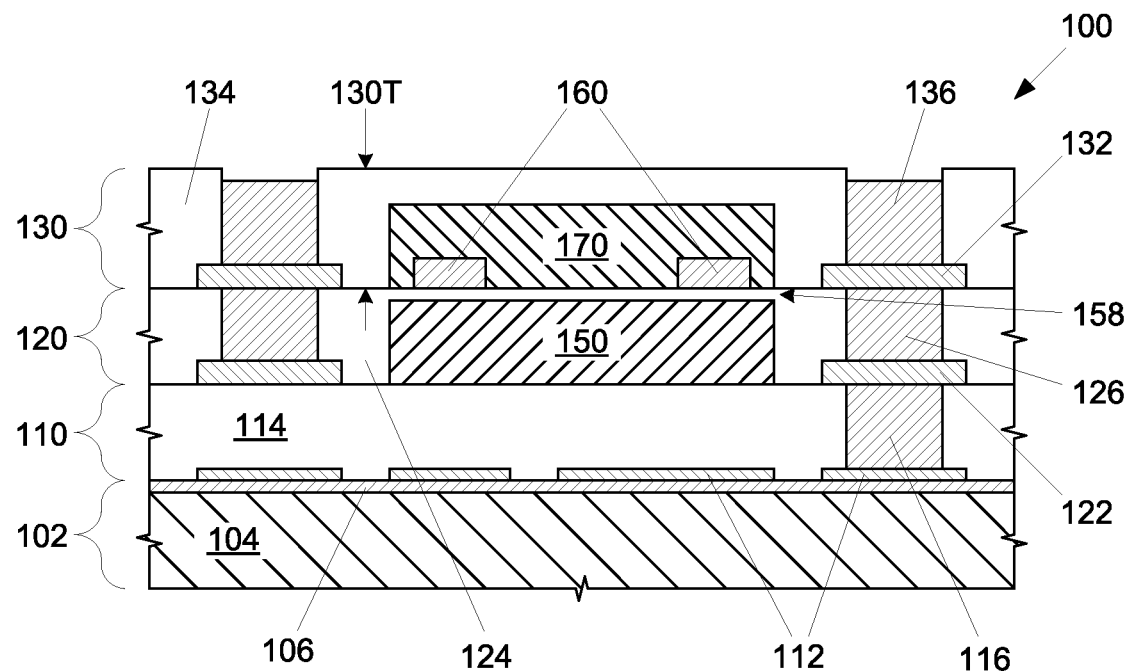

As shown in FIG. 13, a portion of the third level dielectric material layer 134 may be removed to expose the third level conductive via(s) 136, thereby forming a third level 130 of the electronic substrate 100. The removal of the portion of the third level dielectric material layer 134 may be achieved by any technique known in the art, including but not limited to planarization, etching, and the like. In one embodiment of the present description, the portion of the third level dielectric material layer 134 may be removed by chemical mechanical planarization, as known in the art. As further shown in FIG. 13, a portion of the third level dielectric material layer 134 may remain on the second surface 174 of the second magnetic element 170 to prevent the leaching of the material of the second magnetic element 170 in subsequent processing. As still further shown in FIG. 13, the third level conductive vias 136 may be recessed, such as by a flash etch, for purposes of subsequent processing, as will be understood to those skilled in the art. In another embodiment of the present description, the first level 130 may have a thickness 130T of between about 40 and 80 microns.

Figure 14:
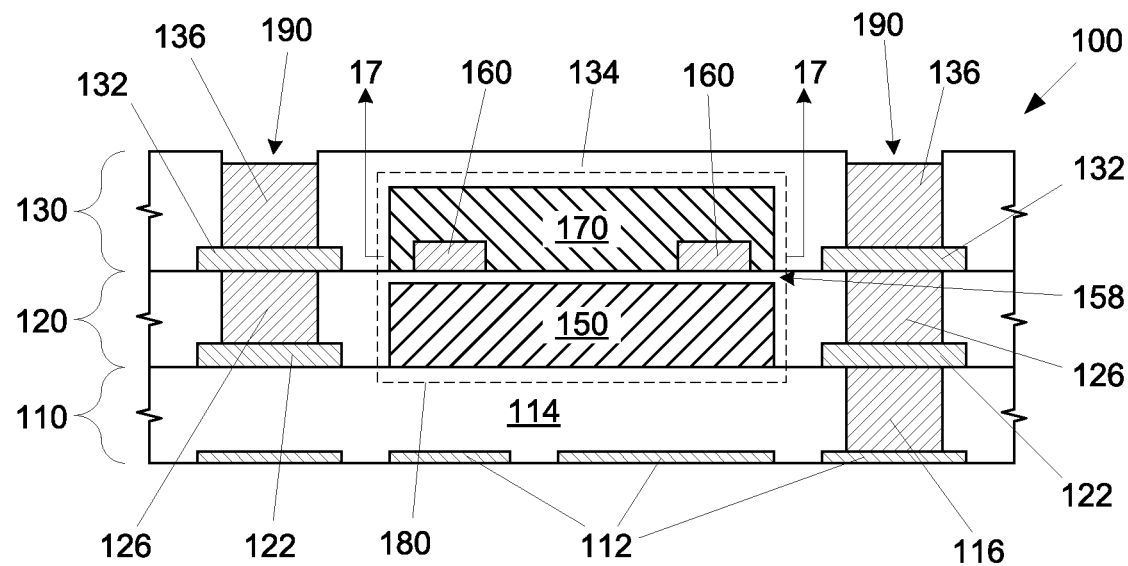

As shown in FIG. 14, the electronic substrate 100 may be removed from the carrier 102 (see FIG. 13). In one embodiment of the present description, an inductor 180, as shown in FIG. 14 within a dashed box, may be defined to include the first magnetic element 150, the second magnetic element 170, the inductor coil 160 between the first magnetic element 150 and the second magnetic element 170, and the dielectric capping layer 158 between the first magnetic element 150 and the second magnetic element 170. Although the electronic substrate 100 is illustrated with three levels (e.g., the first level 110, the second level 120, and the third level 130), the embodiments of the present description are not so limited, as the electronic substrate 100 may have any appropriate number of levels.

As will be understood by those skilled in the art, the conductive traces (e.g., the first level conductive traces 112, the second level conductive traces 122, and the third level conductive traces 132) and the conductive vias (e.g., the first level conductive vias 116, the second level conductive vias 126, and the third level conductive vias 136) form conductive routes 190 or "metallization" extending through the electronic substrate 110.

Figure 15:
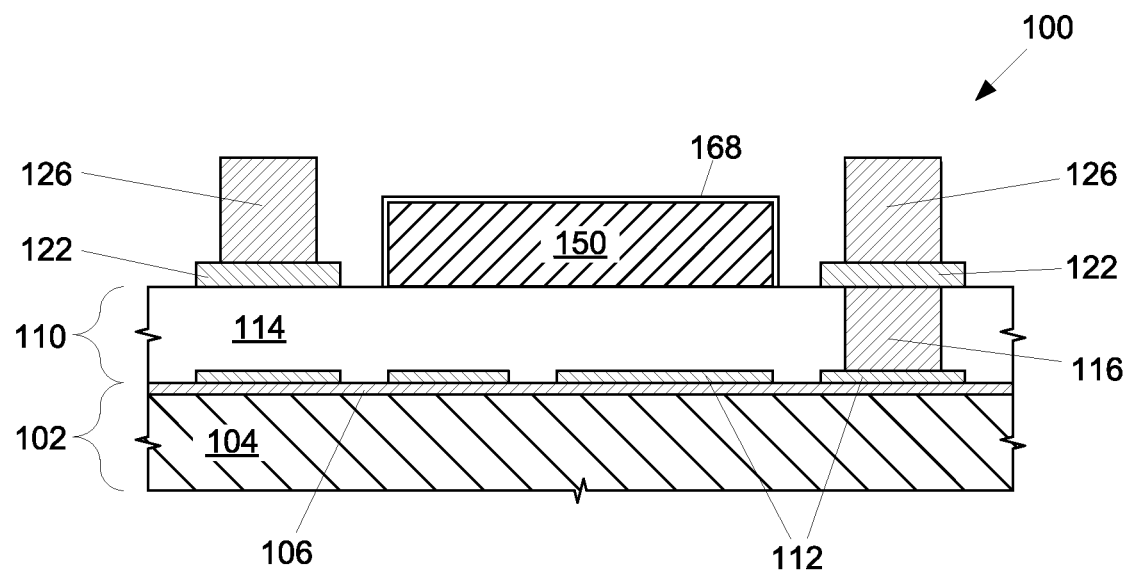
FIGS. 15 and 16 are side cross-sectional views of an alternate process for the fabrication of an inductor in an electronic substrate, according to one embodiment of the present description.
Figure 16:
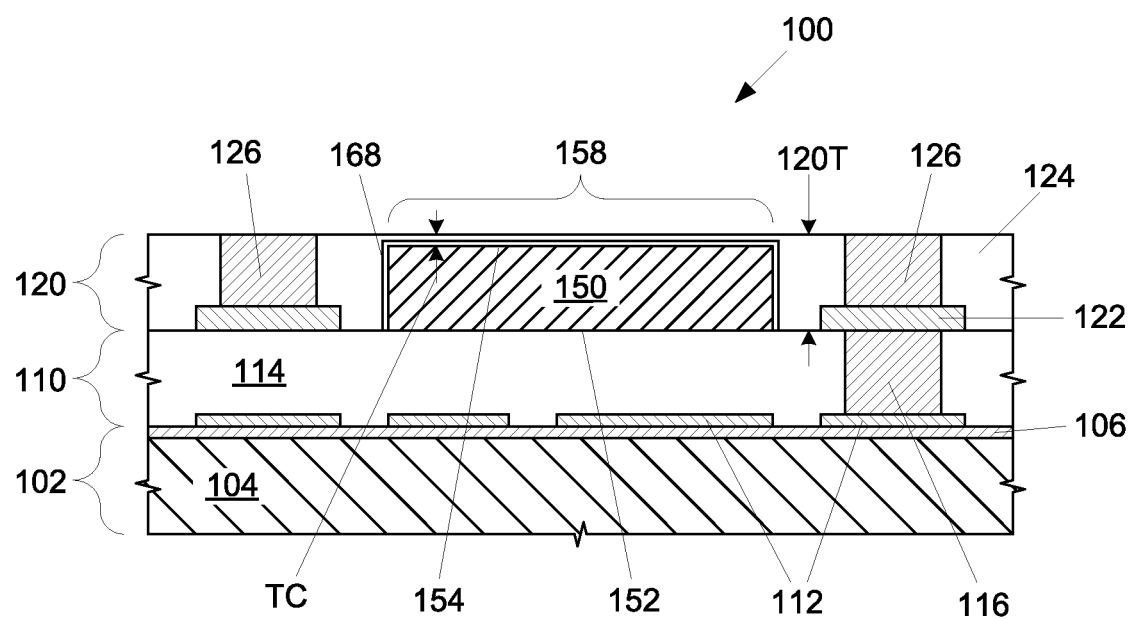

In a further embodiment of the present description, as starting with FIG. 6, a barrier layer 168 may be formed on first magnetic element 150, as shown in FIG. 15. Thus, when the second level dielectric material layer 124 is planarized, such as described with regard to FIG. 8, the thickness TC of the resulting dielectric capping layer 158 and barrier layer 168 may be substantially reduced, or the second level dielectric material layer 124 may be planarized down to the barrier layer 168, such that it becomes the dielectric capping layer 158, which may result in an improvement of the operation of the inductor 180 (see FIG. 14), as will be understood to those skilled in the art.

Figure 17:
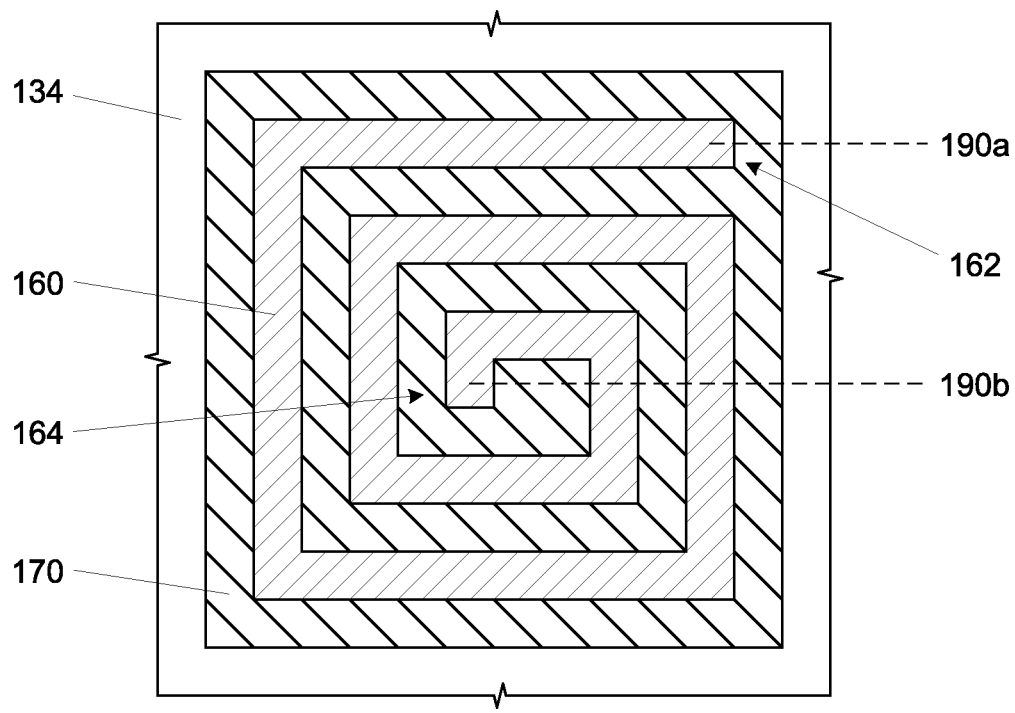
FIGS. 17-19 are top plan views of an inductor coil in an electronic substrate along line 17-17 of FIG. 14, according to various embodiments of the present description.
Figure 18:
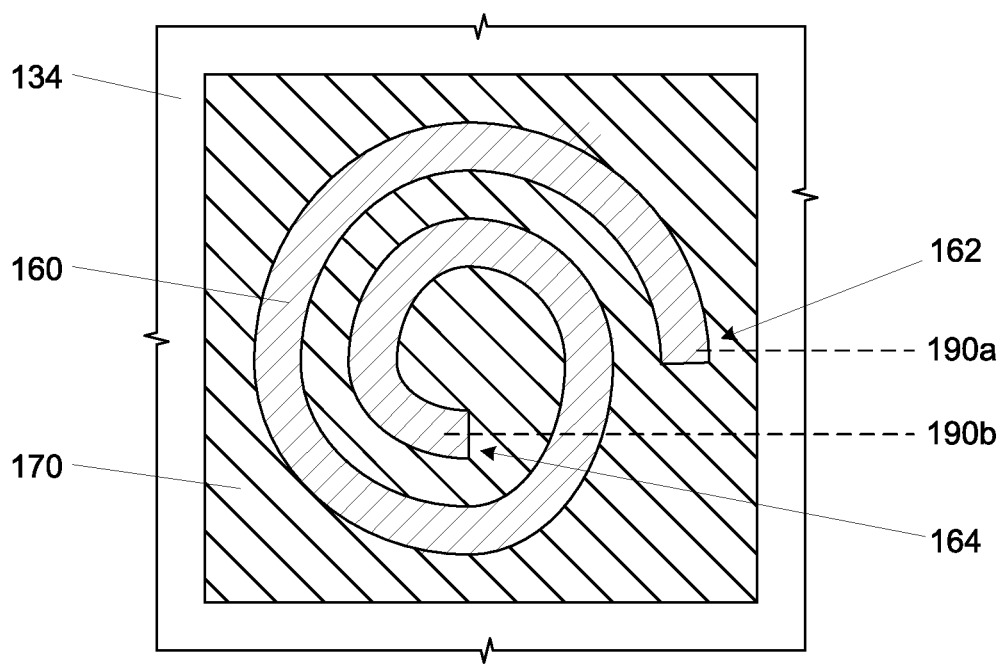
Figure 19:
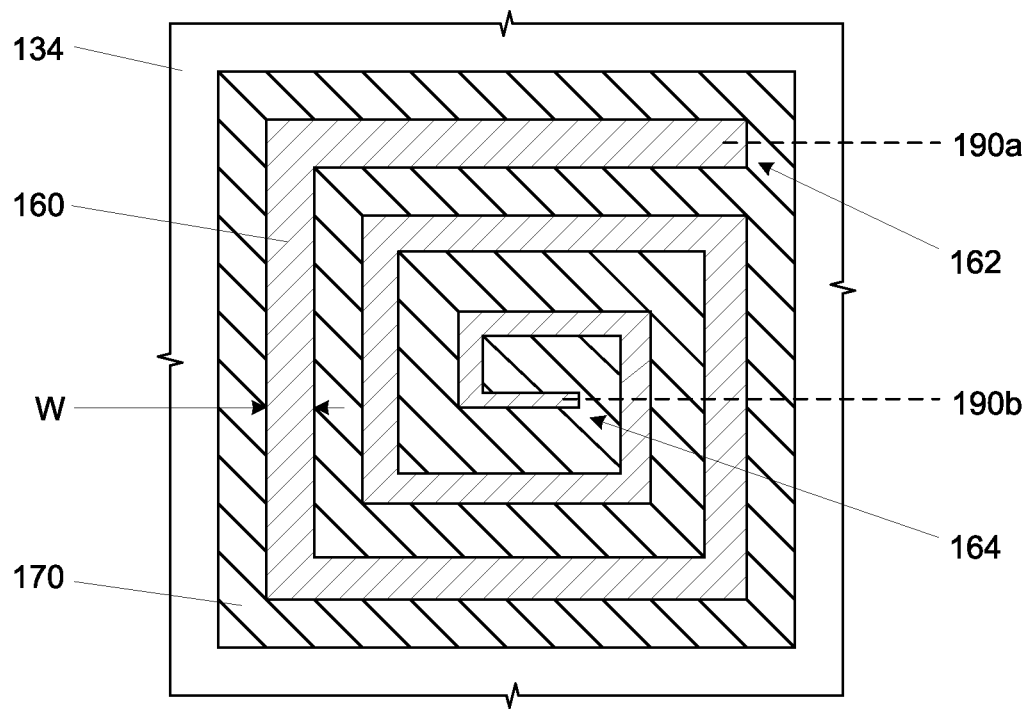

As will further be understood by those skilled in the art, the inductor coil 160 may have any appropriate planar configuration depending on the requirements of the electronic substrate 100. In one embodiment shown in FIG. 17, the inductor coil 160 may comprise a spiraling square. As will be understood to those skilled in the art, a first end 162 of the inductor coil 160 is electrically connected to at least one first conductive route 190a (shown as a dashed line) and a second end 164 of the inductor coil 160 is electrically connected to at least one second conductive route 190b (shown as a dashed line). In another embodiment in FIG. 18, the inductor coil 160 may comprise a circular spiral. It is understood that, in order to achieve specific performance characteristics, the inductor coil 160 can be designed with varying width W and thickness 160T (see FIG. 9), as shown in FIG. 19, which illustrates a variation in the width W of the inductor coil 160.

Figure 20:
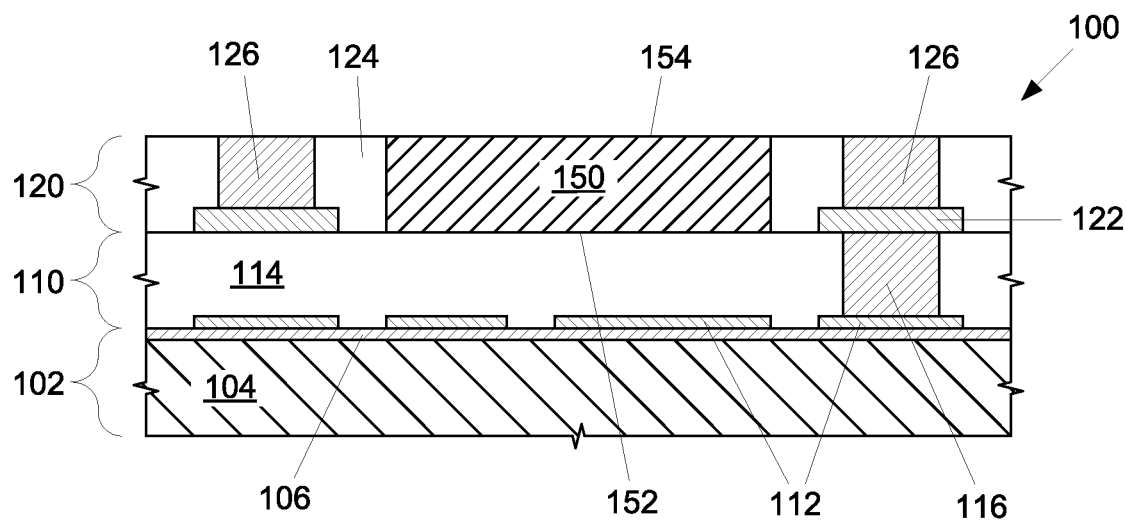
FIGS. 20-26 are side cross-sectional views of a process for the fabrication of an inductor in an electronic substrate, according to another embodiment of the present description.

In another embodiment of the present description, the planarization of the second level dielectric material layer 124, as shown in FIG. 8, may not be sufficiently controllable, such that the second surface 154 of the first magnetic element 150 might be exposed. In such a situation, the material of the first magnetic element 150 can leach into the deposition chemistries/plating solutions. Thus, in one embodiment of the present description, the dielectric capping layer 158 may be formed on the second surface 154 of the first magnetic element 150 separate from the second level dielectric material layer 124. Starting with FIG. 7, a portion of the second level dielectric material layer 124 may be removed to expose the second level conductive via(s) 126, thereby forming the second level 120 of the electronic substrate 100, as shown in FIG. 20. The removal of the portion of the second level dielectric material layer 124 may be achieved by any technique known in the art, including but not limited to grinding, planarization, etching, and the like. In one embodiment of the present description, the portion of the second level dielectric material layer 124 may be removed by chemical mechanical planarization, as known in the art. As further shown in FIG. 20, the removal of the portion of the second level dielectric material layer 124 may expose at least a portion of the second surface 154 of the first magnetic element 150.

Figure 21:
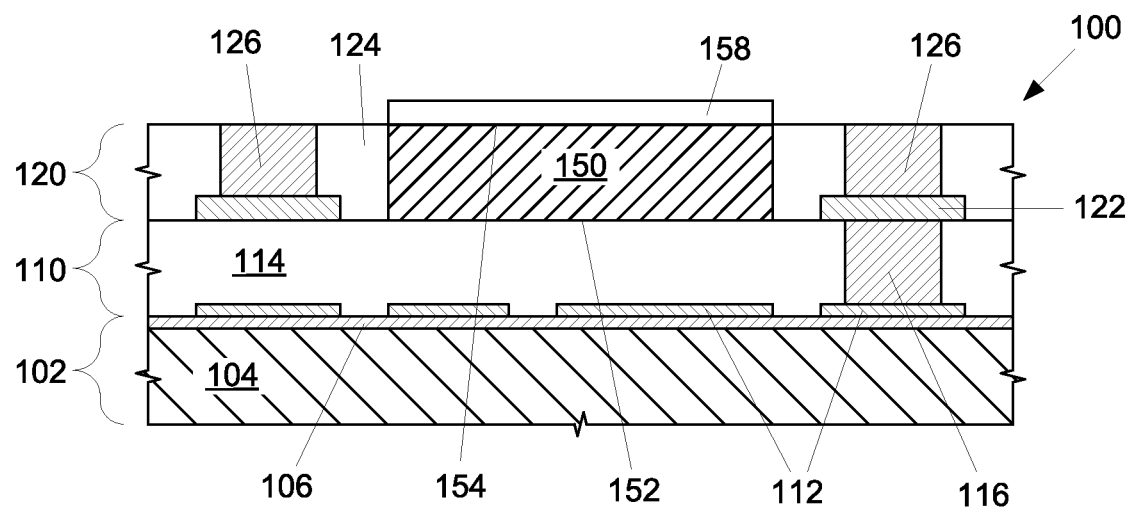

As shown in FIG. 21, in order to protect the first magnetic element 150, the dielectric capping layer 158, which is separate from the second dielectric material layer 124, may be formed on the second surface 154 of the first magnetic element 150. The formation of the dielectric capping layer 158 may be achieved by any known process, including but not limited to, lamination, deposition, and the like. In one embodiment of the present embodiment, the first magnetic element 150 may be substantially encapsulated by the first level dielectric material layer 114, the second level dielectric material layer 124, and the dialect capping layer 158.

Figure 22:
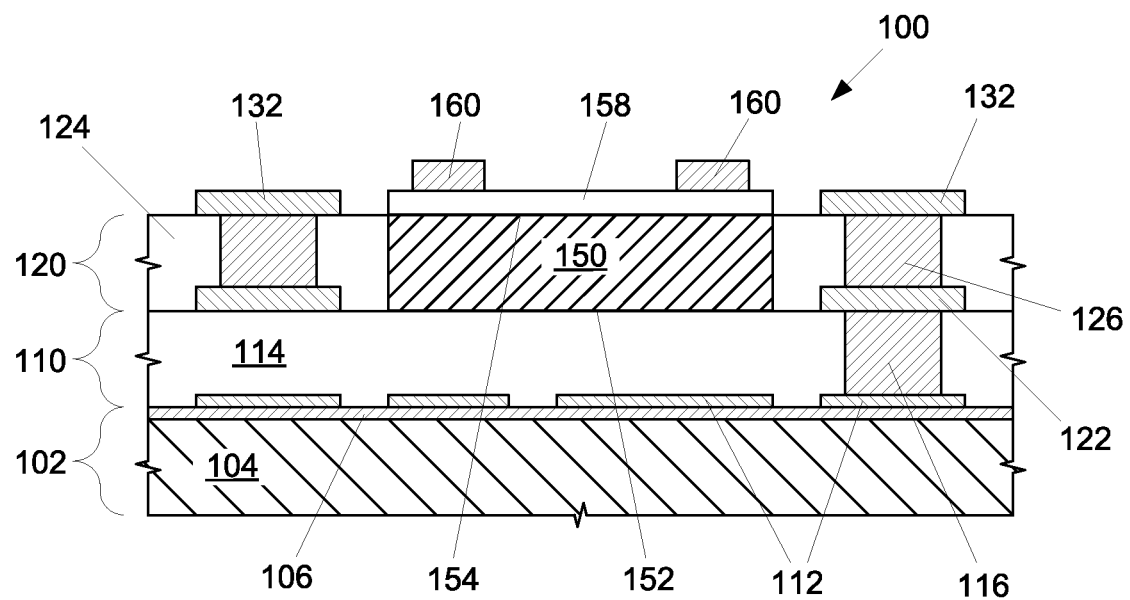

As shown in FIG. 22, the inductor coil 160 may be formed on the dielectric capping layer 158 and the at least one third level conductive trace 132 may be formed on the second level dielectric material layer 124, wherein the at least one third level conductive trace 132 is in contact with the at least one second level conductive via 126. The inductor coil 160 and the at least one third level conductive trace 132 may be formed by any known processes and from any known materials.

Figure 23:
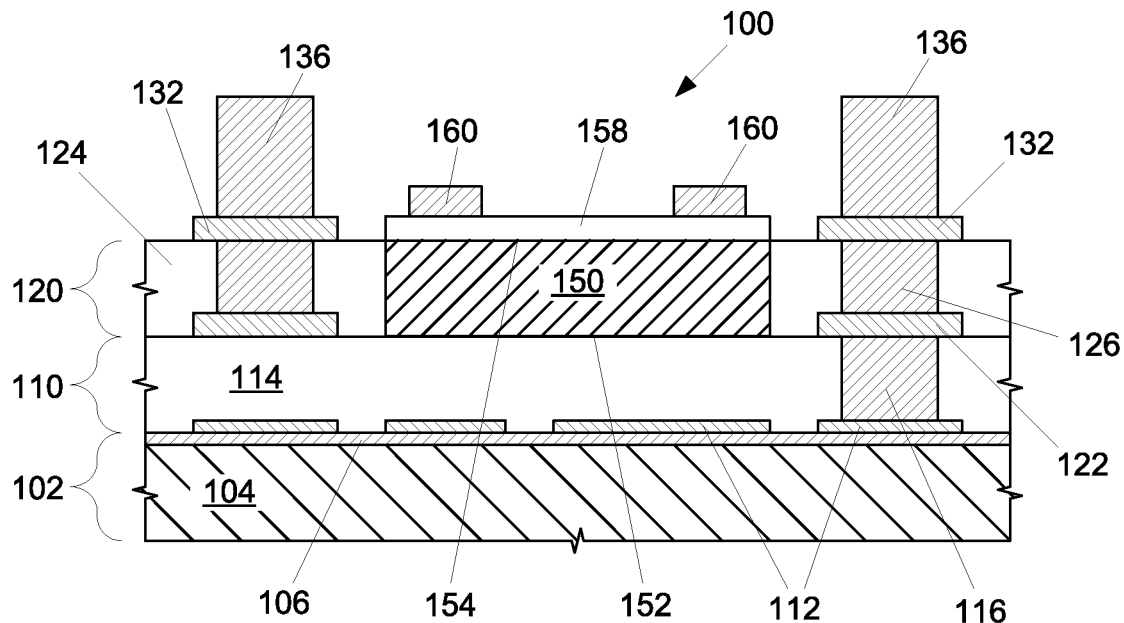

As shown in FIG. 23, at least one third level conductive via 136 may be formed on and be in contact with the at least one third level conductive trace 132. The at least one third level conductive via 136 may be formed in the manner described with regard to FIGS. 2-5, and for the purposes of clarity and conciseness will not be described in detail herein.

Figure 24:
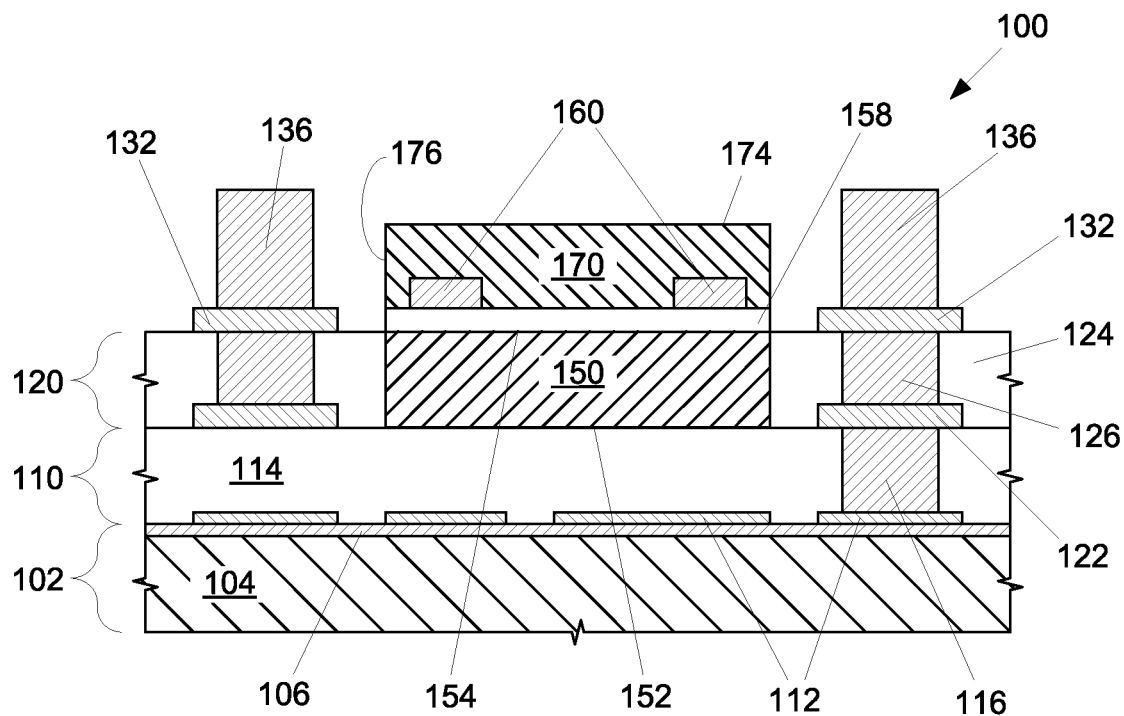

As shown in FIG. 24, the second magnetic element 170 may be formed on the dielectric capping layer 158 and on the inductor coil 160. The second magnetic element 170 may comprise a first surface 172 abutting the dielectric capping layer 158 and an opposing second surface 174, and at least one side 176 extending between the first surface 172 and the second surface 174 of the second magnetic element 170. In one embodiment, the second magnetic element 170, in conjunction with the dielectric capping layer 158, may substantially encapsulate the inductor coil 160. The second magnetic element 170 may be formed by any process known in the art, including, but not limited to printing, lamination, and the like. In one embodiment, the second magnetic element 170 may comprise magnetic filler embedded in a resin. The magnetic filler may include, but is not limited to, iron, nickel, cobalt, rare-earth metals, alloys thereof, composites thereof, and the like. The resin may include, but is not limited to, an organic dielectric epoxy matrix.

Figure 25:
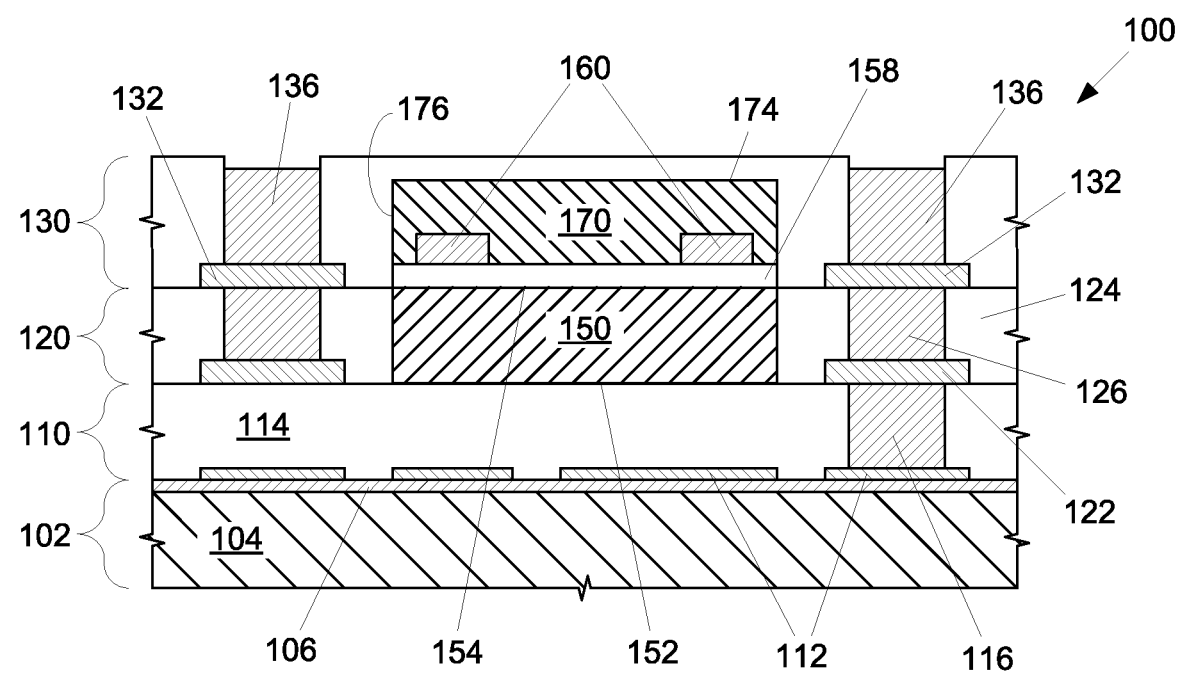
Figure 26:
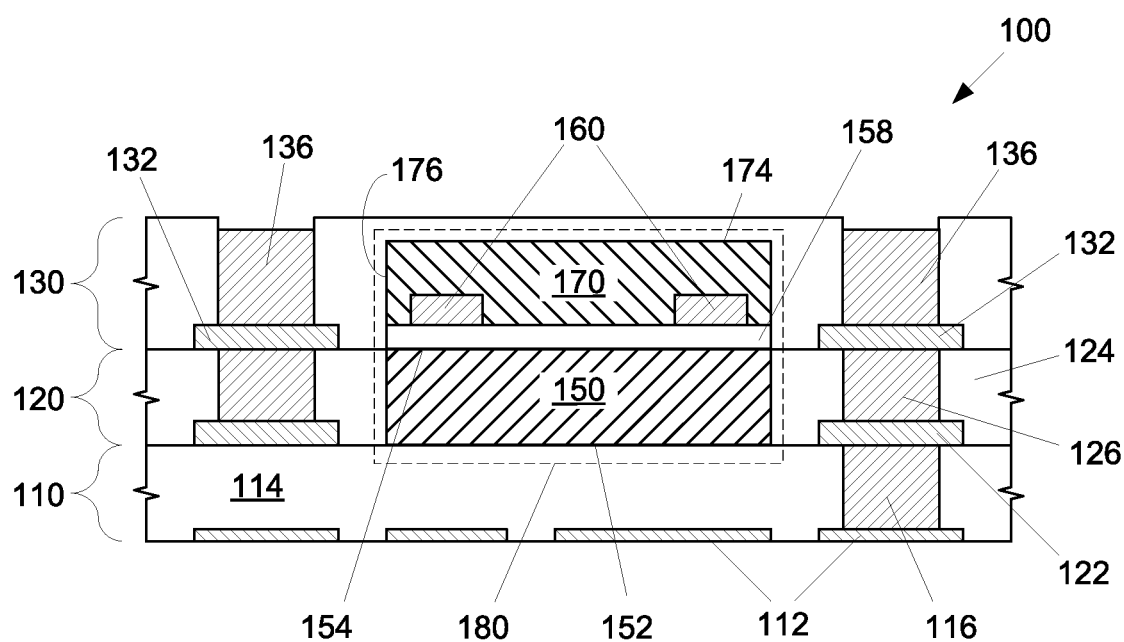

As shown in FIG. 25, the third level dielectric material layer 134 may be formed in the manner discussed with regard to FIGS. 12 and 13. As shown in FIG. 24, the electronic substrate 100 may be removed from the carrier 102 (see FIG. 23). In one embodiment of the present description, an inductor 180, as shown in FIG. 26 within a dashed box, may be defined to include the first magnetic element 150, the second magnetic element 170, the inductor coil 160 between the first magnetic element 150 and the second magnetic element 170, and the dielectric capping layer 158 between the first magnetic element 150 and the second magnetic element 170.

Figure 27:
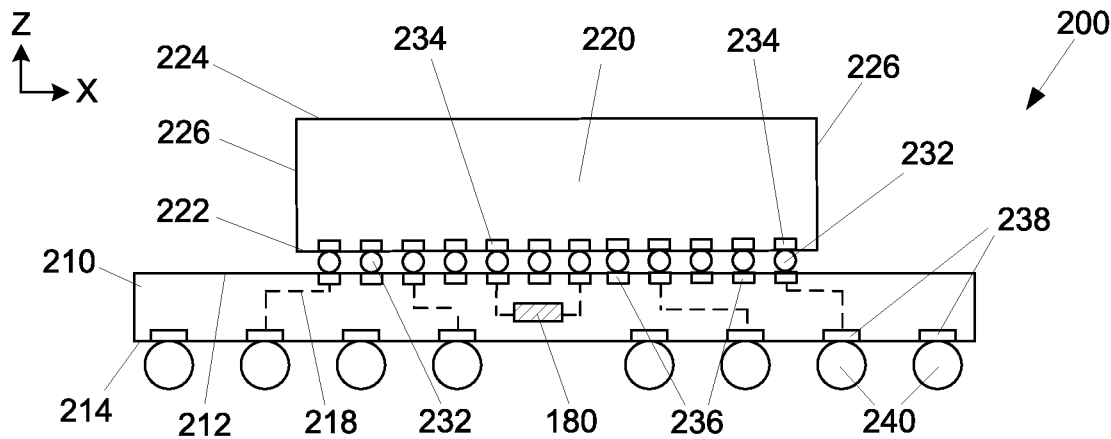
FIG. 27 is a side cross-sectional view of an integrated circuit package having an electronic substrate that contains at least one inductor, according to an embodiment of the present description.

FIG. 27 illustrates an integrated circuit assembly 200 having at least one integrated circuit device 220 electrically attached to an electronic substrate 210 in a configuration generally known as a flip-chip or controlled collapse chip connection ("C4") configuration, according to an embodiment of the present description.

The electronic substrate 210 may be any appropriate structure, including, but not limited to, an interposer. The electronic substrate 210 may have a first surface 212 and an opposing second surface 214. The electronic substrate 210 may comprise a plurality of dielectric material layers (not shown), which may include build-up films and/or solder resist layers, and may be composed of an appropriate dielectric material, including, but not limited to, bismaleimide triazine resin, fire retardant grade 4 material, polyimide material, silica filled epoxy material, glass reinforced epoxy material, and the like, as well as low-k and ultra low-k dielectrics (dielectric constants less than about 3.6), including, but not limited to, carbon doped dielectrics, fluorine doped dielectrics, porous dielectrics, organic polymeric dielectrics, and the like.

The electronic substrate 210 may further include conductive routes 218 or "metallization" (shown in dashed lines) extending through the electronic substrate 210. As will be understood to those skilled in the art, the conductive routes 218 may be a combination of conductive traces (not shown) and conductive vias (not shown) extending through the plurality of dielectric material layers (not shown). The electronic substrate 210 may be fabricated in the manner described for the electronic substrate 100 of FIGS. 1-26 and may include at least one inductor 180 of the present description.

The integrated circuit device 220 may be any appropriate device, including, but not limited to, a microprocessor, a chipset, a graphics device, a wireless device, a memory device, an application specific integrated circuit, a transceiver device, an input/output device, combinations thereof, stacks thereof, or the like. As shown in FIG. 27, the integrated circuit device 220 may have a first surface 222, an opposing second surface 224, and at least one side 226 extending between the first surface 222 and the second surface 224. The integrated circuit device 220 may be a monolithic silicon die or plurality of molded composited dice.

In an embodiment of the present description, the first integrated circuit device 220 may be electrically attached to the electronic substrate 210 with a plurality of device-to-substrate interconnects 232. In one embodiment of the present description, the device-to-substrate interconnects 232 may extend between bond pads 236 on the first surface 212 of the electronic substrate 210 and bond pads 234 on the first surface 222 of the integrated circuit device 220. The device-to-substrate interconnects 232 may be any appropriate electrically conductive material or structure, including, but not limited to, solder balls, metal bumps or pillars, metal filled epoxies, or a combination thereof. In one embodiment, the device-to-substrate interconnects 232 may be solder balls formed from tin, lead/tin alloys (for example, 63% tin/37% lead solder), and high tin content alloys (e.g., 90% or more tin—such as tin/bismuth, eutectic tin/silver, ternary tin/silver/copper, eutectic tin/copper, and similar alloys). In another embodiment, the device-to-substrate interconnects 232 may be copper bumps or pillars. In a further embodiment, the device-to-substrate interconnects 232 may be metal bumps or pillars coated with a solder material.

The bond pads 234 may be in electrical communication with integrated circuitry (not shown) within the integrated circuit device 220. The bond pads 236 on the first surface 212 of the electronic substrate 210 may be in electrical contact with the conductive routes 218. The conductive routes 218 may extend through the electronic substrate 210 and be connected to bond pads 238 on the second surface 214 of the electronic substrate 210. As will be understood to those skilled in the art, the electronic substrate 210 may reroute a fine pitch (center-to-center distance between the bond pads) of the integrated circuit device bond pads 236 to a relatively wider pitch of the bond pads 238 on the second surface 214 of the electronic substrate 210. In one embodiment of the present description, external interconnects 240 may be disposed on the bond pads 238 on the second surface 214 of the electronic substrate 210. The external interconnects 240 may be any appropriate electrically conductive material, including, but not limited to, metal filled epoxies and solders, such as tin, lead/tin alloys (for example, 63% tin/37% lead solder), and high tin content alloys (e.g., 90% or more tin—such as tin/bismuth, eutectic tin/silver, ternary tin/silver/copper, eutectic tin/copper, and similar alloys). The external interconnects 240 may be used to attach the integrated circuit assembly 200 to an external substrate (not shown), such as a motherboard.

Figure 28:
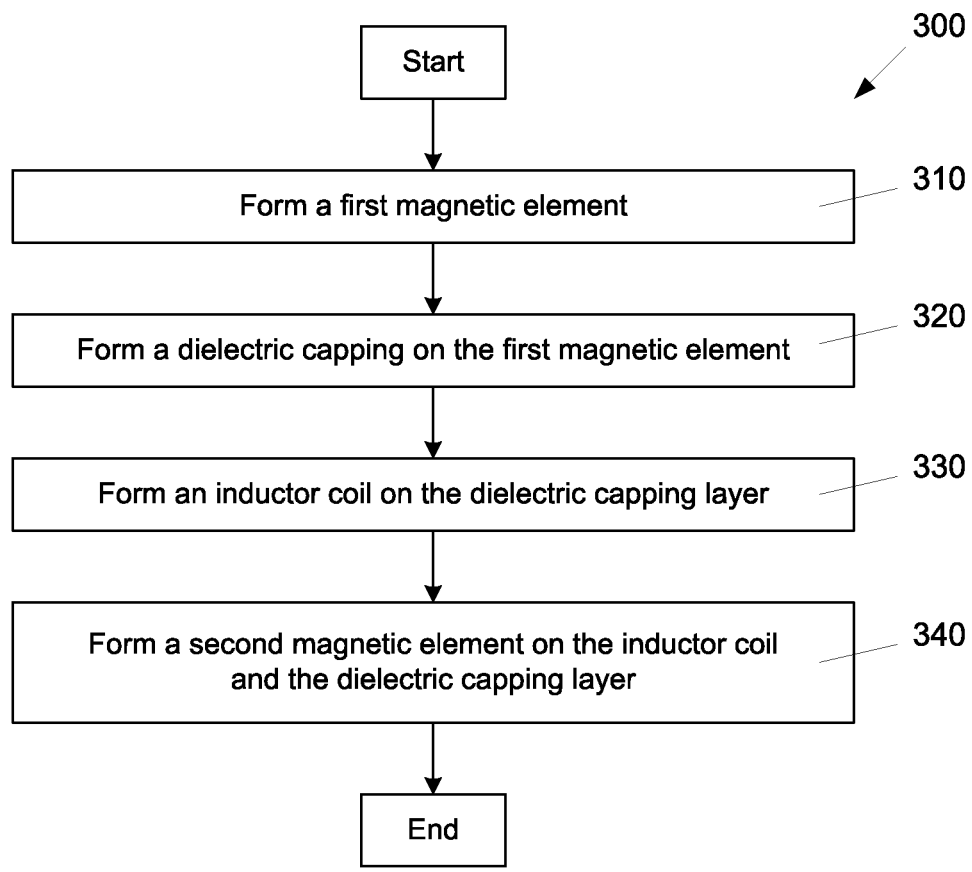
FIG. 28 is a flow diagram of a process for forming an inductor, according to an embodiment of the present description.

FIG. 28 is a flow chart of a process 300 of fabricating an inductor. As set forth in block 310, a first magnetic element may be formed. A dielectric capping layer may be formed on the first magnetic element, as set forth in block 320. As set forth in block 330, an inductor coil may be formed on the dielectric capping layer, as set forth in block 330. A second magnetic element may be formed on the inductor coil and the dielectric capping layer, as set forth in block 340.

Figure 29:
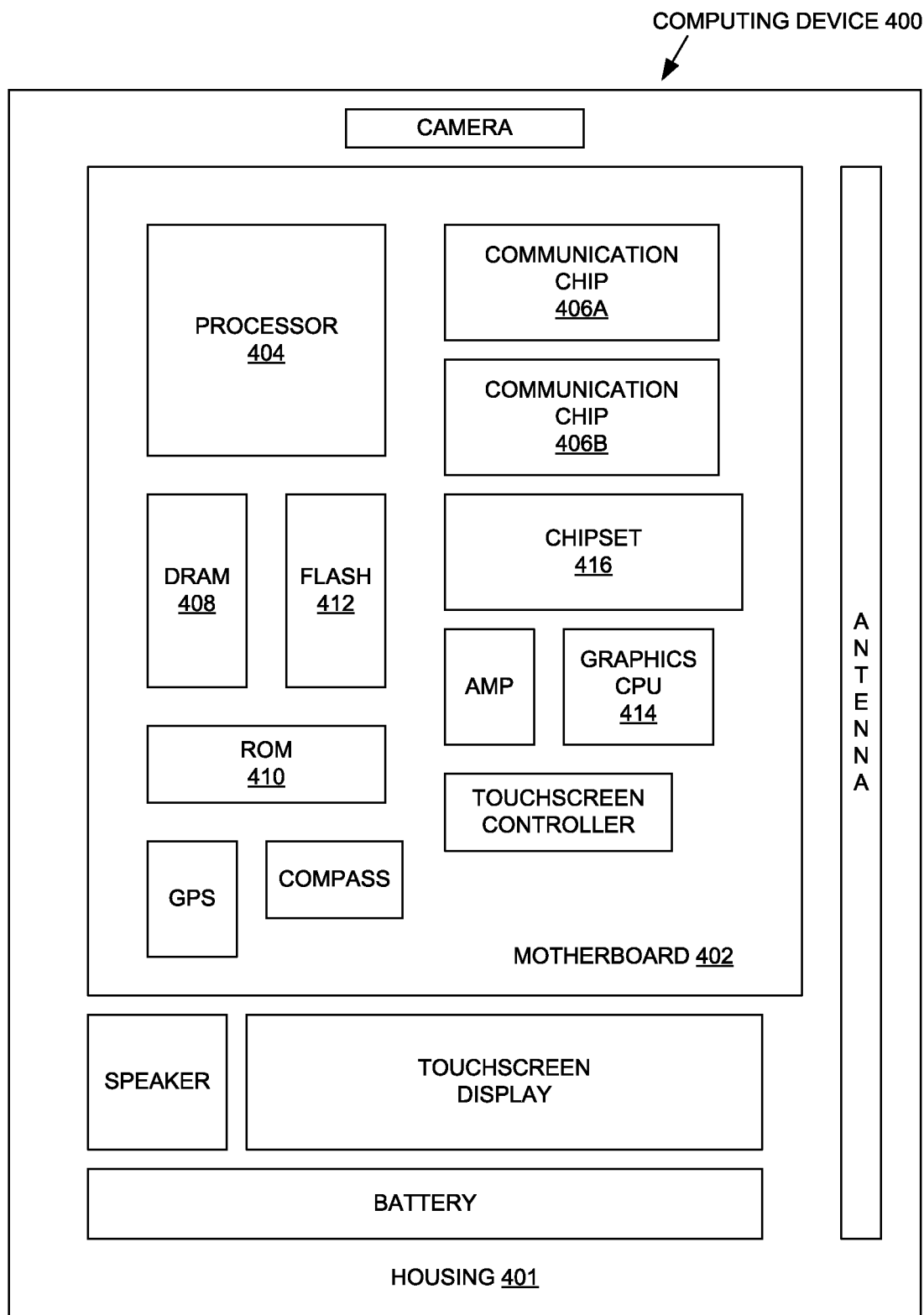
FIG. 29 is an electronic system, according to one embodiment of the present description.

FIG. 29 illustrates an electronic or computing device 400 in accordance with one implementation of the present description. The computing device 400 may include a housing 401 having a board 402 disposed therein. The computing device 400 may include a number of integrated circuit components, including but not limited to a processor 404, at least one communication chip 406A, 406B, volatile memory 408 (e.g., DRAM), non-volatile memory 410 (e.g., ROM), flash memory 412, a graphics processor or CPU 414, a digital signal processor (not shown), a crypto processor (not shown), a chipset 416, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker, a camera, and a mass storage device (not shown) (such as hard disk drive, compact disk (CD), digital versatile disk (DVD), and so forth). Any of the integrated circuit components may be physically and electrically coupled to the board 402. In some implementations, at least one of the integrated circuit components may be a part of the processor 404.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

At least one of the integrated circuit components may include an electronic substrate having an inductor embedded, wherein the inductor may comprise a first magnetic element, a second magnetic element, a dielectric capping layer between the first magnetic element and the second magnetic element, and an inductor coil between the first magnetic element and the second magnetic element.

In various implementations, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-29. The subject matter may be applied to other integrated circuit devices and assembly applications, as well as any appropriate electronic application, as will be understood to those skilled in the art.

The following examples pertain to further embodiments and specifics in the examples may be used anywhere in one or more embodiments, wherein Example 1 is an apparatus comprising a first magnetic element, a second magnetic element, a dielectric capping layer between the first magnetic element and the second magnetic element, and an inductor coil between the first magnetic element and the second magnetic element.

In Example 2, the subject matter of Example 1 can optionally include the inductor coil being at least partially embedded in the second magnetic element.

In Example 3, the subject matter of any of Examples 1 to 2 can optionally include the inductor coil being substantially encapsulated by the second magnetic element and the dielectric capping layer.

In Example 4, the subject matter of any of Examples 1 to 3 can optionally include a dielectric material layer, wherein the first magnetic element is at least partially embedded in the dielectric material layer and wherein the dielectric capping layer comprises a portion of the dielectric material layer.

In Example 5, the subject matter of any of Examples 1 to 3 can optionally include a dielectric material layer, wherein the first magnetic element is at least partially embedded in the dielectric material layer and wherein the dielectric capping layer comprises a dielectric material separate from the dielectric material layer.

Example 6 is an apparatus comprising an electronic substrate, wherein the electronic substrate comprises a first level dielectric material layer, a first magnetic element formed on the first level dielectric material layer, a second level dielectric material layer, wherein second level dielectric material layer abuts the first magnetic element, a dielectric capping layer on the first magnetic element, a second magnetic element on dielectric capping layer, an inductor coil on the dielectric capping between the first magnetic element and the second magnetic element, and a plurality of conductive routes within the electronic substrate; and at least one integrated circuit device attached to the electronic substrate.

In Example 7, the subject matter of Example 6 can optionally include the inductor coil being at least partially embedded by the second magnetic element.

In Example 8, the subject matter of Example 6 can optionally include the inductor coil being substantially encapsulated by the second magnetic element and the dielectric capping layer.

In Example 9, the subject matter of any of Examples 6 to 8 can optionally include the first magnetic element being at least partially embedded in the second level dielectric material layer and wherein the dielectric capping layer comprises a portion of the second level dielectric material layer.

In Example 10, the subject matter of any of Examples 6 to 8 can optionally include the first magnetic element being at least partially embedded in the second dielectric material layer and wherein the dielectric capping layer comprises a dielectric material separate from the first dielectric material layer.

In Example 11, the subject matter of any of Examples 6 to 8 can optionally include the first magnetic element being substantially encapsulated by the first level dielectric layer, the second level dielectric material layer, and the dielectric capping layer.

In Example 12, the subject matter of any of Examples 6 to 11 can optionally include a second level dielectric material layer on the second magnetic element and the first level dielectric material layer, wherein the second magnetic element is substantially encapsulated by the dielectric capping layer and the second level dielectric material layer.

In Example 13, the subject matter of any of Examples 6 to 12 can optionally include the inductor coil is electrically attached to at least two conductive routes of the plurality of conductive routes.

In Example 14, the subject matter of any of Examples 6 to 13 can optionally include an electronic board, wherein the electronic substrate is attached to the electronic board.

Example 15 is a method of fabricating an electronic substrate comprising forming a first magnetic element, forming a dielectric capping layer on the first magnetic element, forming an inductor coil on the dielectric capping layer, and forming a second magnetic element on the inductor coil and the dielectric capping layer.

In Example 16, the subject matter of Example 15 can optionally include forming the second magnetic element at least partially embedding the inductor coil therein.

In Example 17, the subject matter of Example 16 can optionally include forming the second magnetic element substantially encapsulating the inductor coil by the second magnetic element and the dielectric capping layer.

In Example 18, the subject matter of Example 16 can optionally include forming at least one first level conductive trace; forming a first level dielectric material layer on the at least one first level conductive trace; forming at least one first level conductive via extending through the first level dielectric material layer and in contact with the at least one first level conductive trace; forming at least one second level conductive trace on the first level dielectric material layer and in contact with the at least one first level conductive via; forming at least one second level conductive via on the first level conductive trace; wherein forming the first magnetic element comprises forming the first magnetic element on the first level dielectric material layer after the formation of the second level conductive via; and forming a second level dielectric material layer on the first level dielectric layer, wherein second level dielectric material layer abuts the first magnetic element.

In Example 19, the subject matter of Example 18 can optionally include planarizing the second level dielectric material layer, wherein a portion of the second level dielectric material layer remains on the first magnetic element to form the dielectric capping layer.

In Example 20, the subject matter of Example 18 can optionally include forming the dielectric capping layer comprises forming a dielectric material separate from the first dielectric material layer.

In Example 21, the subject matter of any of Examples 18 to 20 can optionally include the first magnetic element is substantially encapsulated by the first level dielectric material layer, the second level dielectric material layer, and the dielectric capping layer.

In Example 22, the subject matter of any of Examples 18 to 21 can optionally include the second magnetic element is substantially encapsulated by the dielectric capping layer and the second level dielectric material layer.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:
1. An apparatus, comprising:
a first magnetic element on only a first dielectric material layer;

a second dielectric material layer over, and in contact with, the first magnetic element and the first dielectric material layer;

a second magnetic element over the first magnetic element, and in contact with a surface of the second dielectric material layer, the second dielectric material layer having a non-zero thickness between the first magnetic element and the second magnetic element; and an inductor coil over the first magnetic element, in contact with the surface of the second dielectric material layer, and partially embedded within the second magnetic element, wherein the second dielectric material layer has the non-zero thickness between the first magnetic element and the inductor coil.

2. The apparatus of claim 1, further comprising a third dielectric material layer over the second magnetic element and over the second dielectric material layer, wherein the inductor coil is coplanar with a first conductive trace adjacent to the second magnetic element, wherein the first conductive trace is in contact with a first conductive via, and wherein the first conductive trace and the first conductive via extend through a thickness of the third dielectric material layer.

3. The apparatus of claim 1, wherein the inductor coil is encapsulated by the second magnetic element and the second magnetic element is encapsulated by the second dielectric material layer.

4. The apparatus of claim 1, wherein the first magnetic element is encapsulated by the second dielectric material layer.

5. The apparatus of claim 1, further comprising a barrier dielectric material layer, and wherein the second dielectric material layer is over the barrier dielectric material layer.

6. The apparatus of claim 1, further comprising:
at least one integrated circuit device coupled to the inductor coil through conductive routes comprising a first trace and a first via embedded within the second dielectric material layer, wherein a surface of the via is coplanar with the surface of the second dielectric material layer.

7. The apparatus of claim 6, wherein first and second ends of the inductor coil are electrically coupled to two conductive routes.

8. The apparatus of claim 6, further comprising an electronic board, wherein the apparatus is attached to the electronic board.

9. A coreless package substrate, comprising:
a first metallization level on a first side of the coreless package substrate, the first metallization level within a first layer of organic dielectric material and comprising a first conductive trace in direct contact with a first conductive via;

a body of magnetic material embedded within a second layer of organic dielectric material, and extending over only the first layer of organic dielectric material, wherein a top surface of the second layer of organic dielectric material extends over the body of magnetic material and is in contact with the first layer of organic dielectric material within an area beyond the body of magnetic material;

a second conductive trace adjacent to the body of magnetic material, in contact with the first conductive via, and embedded within the second layer of organic dielectric material;

a second conductive via in contact with the second conductive trace and embedded within the second layer of organic dielectric material, wherein a top surface of the second conductive via is coplanar with the top surface of the second layer of organic dielectric material;

a second metallization level on a second side of the coreless package substrate, the second metallization level within a third layer of organic dielectric material and comprising an inductor coil over the magnetic material, wherein the inductor coil is in direct contact with the second layer of organic dielectric material and spaced apart from the body of magnetic material by a non-zero thickness of the second layer of organic dielectric material.

10. The coreless package substrate of claim 9, wherein the inductor coil is in direct contact with the second layer of organic dielectric material.

11. The coreless package substrate of claim 9, further comprising a second body of magnetic material embedded within the third layer of organic dielectric material, wherein a top surface of the third layer of organic dielectric material extends over the second body of magnetic material, and a top surface of the second body of magnetic material extends over a top surface of the inductor coil.

12. The coreless package substrate of claim 11, wherein the second metallization level comprises a third conductive trace in contact with the second conductive via.

13. The coreless package substrate of claim 12, wherein a portion of the third layer of organic dielectric material is between the third conductive trace and the second body of magnetic material.

14. The coreless package substrate of claim 12, wherein the second metallization level comprises a third conductive via in contact with the third conductive trace, and wherein a top surface of the third layer of organic polymeric dielectric material is adjacent to, but not over, the third conductive via.

* * * * *